(12) United States Patent
DeMars

(10) Patent No.: US 9,613,548 B2
(45) Date of Patent: Apr. 4, 2017

(54) ADVANCED COOLING SYSTEM FOR ELECTRONIC DISPLAY

(71) Applicant: Manufacturing Resources International, Inc., Alpharetta, GA (US)

(72) Inventor: Ryan DeMars, Alpharetta, GA (US)

(73) Assignee: Manufacturing Resources International, Inc., Alpharetta, GA (US)

( * ) Notice: Subject to any disclaimer, the term of this patent is extended or adjusted under 35 U.S.C. 154(b) by 165 days.

(21) Appl. No.: 14/590,542

(22) Filed: Jan. 6, 2015

(65) Prior Publication Data

US 2016/0198588 A1    Jul. 7, 2016

(51) Int. Cl.
  *H05K 7/20*  (2006.01)
  *G09F 9/33*  (2006.01)
  *G02F 1/1333* (2006.01)

(52) U.S. Cl.
  CPC .......... *G09F 9/33* (2013.01); *G02F 1/133385* (2013.01); *G02F 2201/36* (2013.01)

(58) Field of Classification Search
  CPC .............................. H05K 7/20154; G09F 9/33
  See application file for complete search history.

(56) References Cited

U.S. PATENT DOCUMENTS

| | | | |
|---|---|---|---|
| 4,093,355 A | 6/1978 | Kaplit et al. | |
| 4,593,978 A | 6/1986 | Mourey et al. | |
| 4,634,225 A | 1/1987 | Haim et al. | |
| 4,921,041 A | 5/1990 | Akachi | |
| 5,029,982 A | 7/1991 | Nash | |
| 5,088,806 A | 2/1992 | McCartney et al. | |
| 5,247,374 A | 9/1993 | Terada | |
| 5,559,614 A | 9/1996 | Urbish et al. | |
| 5,748,269 A | 5/1998 | Harris et al. | |
| 5,767,489 A | 6/1998 | Ferrier | |
| 5,818,010 A | 10/1998 | McCann | |
| 5,869,919 A | 2/1999 | Sato | |

(Continued)

FOREIGN PATENT DOCUMENTS

| | | |
|---|---|---|
| GB | 2402205 | 1/2004 |
| JP | 03153212 | 7/1991 |

(Continued)

OTHER PUBLICATIONS

Zeef, Hubing, EMC analysis of 18' LCD Monitor, Aug. 2000, 1 page.

*Primary Examiner* — Elmito Breval
(74) *Attorney, Agent, or Firm* — Standley Law Group LLP

(57) ABSTRACT

Exemplary embodiments provide an advanced cooling system for an electronic display having a plurality of open loop fluid flow paths as well as a closed loop fluid flow path. The open loop divides a fluid, such as ambient air, among a series of sub-paths including front and rear open loop layers and a heat exchanger. The first and second open loop layers may comprise a corrugated element, forming peaks and valleys. The peaks and valleys of the front and rear layers may be arranged such that they do not align. A section of the rear open loop layer may be sealed from open loop flow. The closed loop preferably passes through an electronics compartment and the heat exchanger, also passing in front of the electronic display.

20 Claims, 15 Drawing Sheets

DETAIL C

(56) References Cited

U.S. PATENT DOCUMENTS

| | | |
|---|---|---|
| 5,991,153 A | 11/1999 | Heady et al. |
| 6,089,751 A | 7/2000 | Conover et al. |
| 6,157,432 A | 12/2000 | Helbing |
| 6,191,839 B1 | 2/2001 | Briley |
| 6,417,900 B1 | 7/2002 | Shin et al. |
| 6,428,198 B1 | 8/2002 | Saccomanno |
| 6,437,673 B1 | 8/2002 | Nishida |
| 6,473,150 B1 | 10/2002 | Takushima |
| 6,493,440 B2 | 12/2002 | Gromatzky |
| 6,535,266 B1 | 3/2003 | Nemeth et al. |
| 6,628,355 B1 | 9/2003 | Takahara |
| 6,683,639 B2 | 1/2004 | Driessen-Olde Scheper |
| 6,839,104 B2 | 1/2005 | Taniguchi et al. |
| 6,885,412 B2 | 4/2005 | Ohnishi et al. |
| 6,943,768 B2 | 9/2005 | Cavanaugh et al. |
| 7,059,757 B2 | 6/2006 | Shimizu |
| 7,083,285 B2 | 8/2006 | Hsu |
| 7,284,874 B2 | 10/2007 | Jeong et al. |
| 7,752,858 B2 | 7/2010 | Johnson |
| 7,813,124 B2 | 10/2010 | Karppanen |
| 8,035,968 B2 | 10/2011 | Kwon |
| 8,369,083 B2 | 2/2013 | Dunn |
| 2002/0101553 A1 | 8/2002 | Enomoto et al. |
| 2002/0126248 A1 | 9/2002 | Yoshida |
| 2003/0007109 A1 | 1/2003 | Park |
| 2004/0036834 A1 | 2/2004 | Ohnishi et al. |
| 2004/0165139 A1 | 8/2004 | Anderson et al. |
| 2005/0213950 A1 | 9/2005 | Yoshimura |
| 2006/0012985 A1 | 1/2006 | Archie, Jr. |
| 2006/0018093 A1 | 1/2006 | Lai |
| 2006/0082271 A1 | 4/2006 | Lee et al. |
| 2006/0132699 A1 | 6/2006 | Cho et al. |
| 2006/0199514 A1 | 9/2006 | Kimura |
| 2006/0209266 A1 | 9/2006 | Utsunomiya |
| 2006/0283579 A1 | 12/2006 | Ghosh |
| 2007/0019419 A1 | 1/2007 | Hafuka et al. |
| 2007/0140671 A1 | 6/2007 | Yoshimura |
| 2007/0151664 A1 | 7/2007 | Shin |
| 2007/0171353 A1 | 7/2007 | Hong |
| 2009/0126906 A1 | 5/2009 | Dunn |
| 2009/0154096 A1 | 6/2009 | Iyengar |
| 2011/0013114 A1 | 1/2011 | Dunn |
| 2011/0085301 A1 | 4/2011 | Dunn |
| 2012/0038849 A1 | 2/2012 | Dunn |
| 2012/0106081 A1 | 5/2012 | Hubbard |
| 2012/0206687 A1* | 8/2012 | Dunn ............... G02F 1/133385 349/161 |
| 2012/0249402 A1 | 10/2012 | Kang |
| 2012/0255704 A1 | 10/2012 | Nakamichi |
| 2012/0274876 A1 | 11/2012 | Cappaert |

FOREIGN PATENT DOCUMENTS

| | | |
|---|---|---|
| JP | 08194437 | 7/1996 |
| JP | 11160727 | 6/1999 |
| JP | 2002158475 | 5/2002 |
| JP | 2005134849 | 5/2005 |
| JP | 2005-265922 | 9/2005 |
| JP | 2008292743 | 12/2008 |
| KR | 20060016469 | 2/2006 |
| KR | 100666961 | 1/2007 |
| KR | 1020070070675 | 7/2007 |
| WO | WO2005079129 | 8/2005 |
| WO | WO2010-007821 | 1/2010 |

\* cited by examiner

US 9,613,548 B2

ADVANCED COOLING SYSTEM FOR ELECTRONIC DISPLAY

TECHNICAL FIELD

Embodiments of the present invention generally relate to cooling systems for electronic displays.

BACKGROUND

Electronic displays are sometimes used in outdoor environments or other areas where the surrounding temperatures may be high or there may be other sources of heat such as solar loading causing the temperatures within the display to rise. However, some portions of the display can be difficult to cool as simply ingesting ambient air into some portions of the display can introduce dust and contaminates into sensitive portions of the display, which can lead to premature failures.

SUMMARY OF THE INVENTIVE CONCEPT

Exemplary embodiments may comprise multiple separate flow paths for a fluid, such as air, through an electronic display. At least one path may be a closed loop and several other paths may provide open loops. The closed loop path preferably circulates in a sealed electronics compartment defined by a back pan, a perimeter wall, and a rear panel. The closed loop may further circulate through a heat exchanger located in the sealed electronics compartment as well as pass between the electronic display and a front transparent window. A rear open loop path as well as a front open loop path may be used to remove heat from the electronics as well as the backlight. The fans can be positioned so as to precisely control the amount of fluid travelling through each path.

BRIEF DESCRIPTION OF THE DRAWINGS

In addition to the features mentioned above, other aspects of the present invention will be readily apparent from the following descriptions of the drawings and exemplary embodiments, wherein like reference numerals across the several views refer to identical or equivalent features, and wherein.

DETAILED DESCRIPTION OF EXEMPLARY EMBODIMENT(S)

Figure 1:
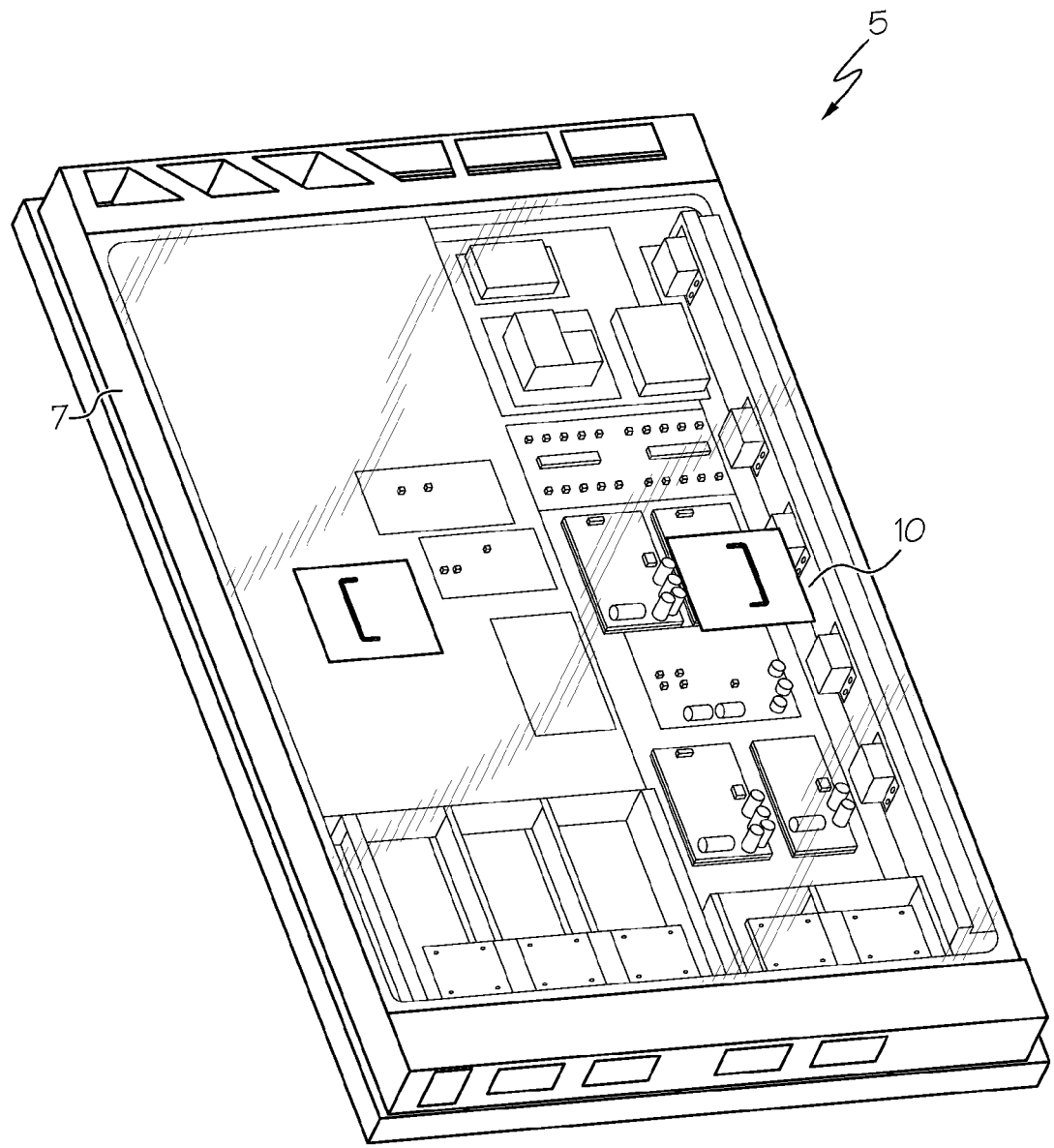
FIG. 1 is a rear perspective view of an exemplary embodiment of the electronic display assembly.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the invention are described herein with reference to illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is an exemplary embodiment of an electronic display assembly (hereinafter also the "assembly"), indicated generally at 5. The electronic display assembly 5 is illustrated with a rear panel 10 in place that covers the majority of the rear surface of the assembly 5. A perimeter wall 7 extends around the four sides of the assembly 5.

Figure 2:
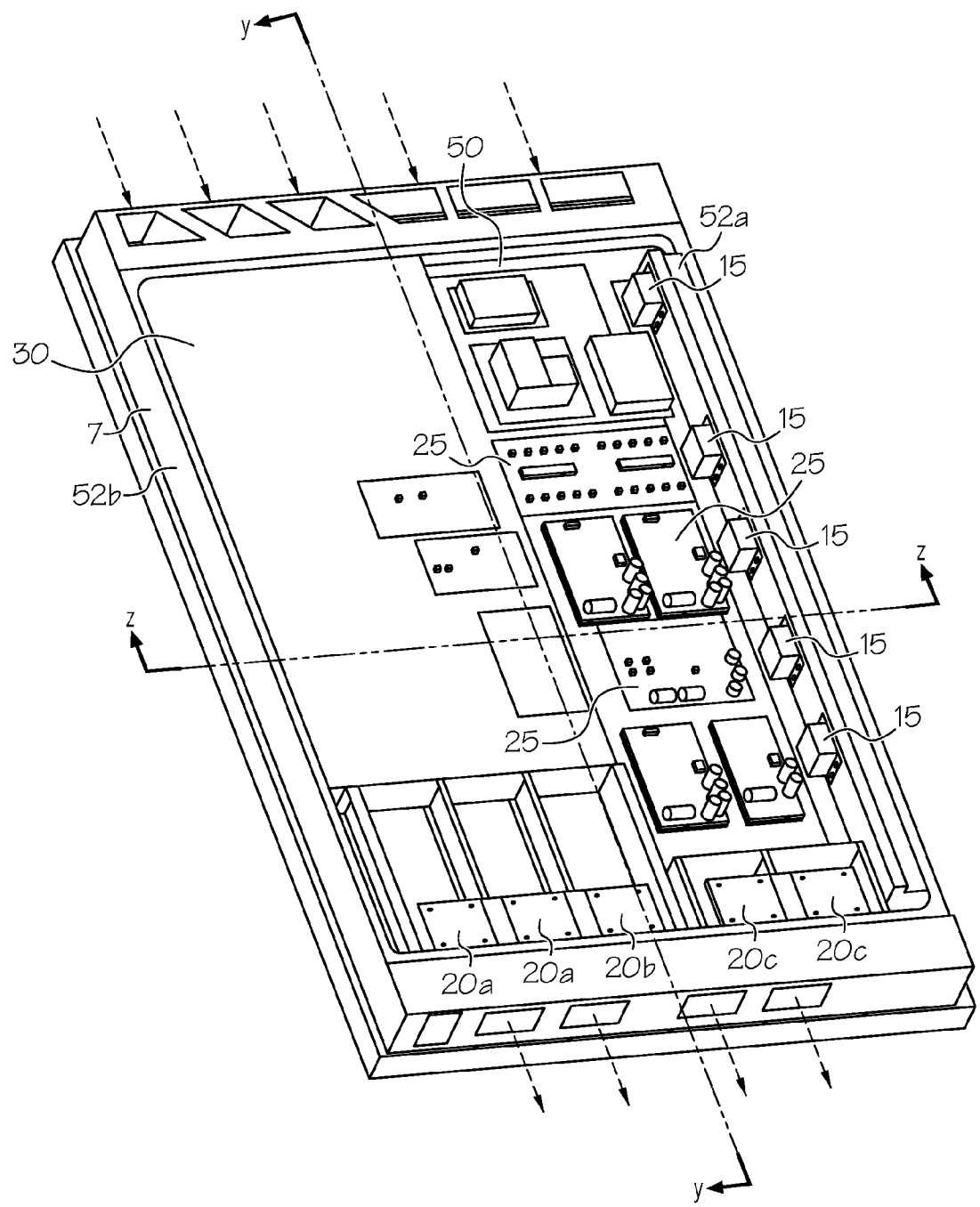
FIG. 2 is a rear perspective view of the electronic display assembly of FIG. 1 with the rear panel removed and showing the location of section line Y-Y and section line Z-Z.

FIG. 2 illustrates the assembly 5 with the rear panel 10 removed. The assembly 5 preferably houses a series of electronic components 25 preferably secured to a back pan 50. The back pan 50 is preferably sized to fit within the perimeter wall 7. A heat exchanger 30 extends over a portion of the back pan 50 and may be secured thereto, but preferably contains a small gap between the front surface of the heat exchanger and the rear surface of the back pan 50. The heat exchanger 30 is preferably a cross flow heat exchanger, but many types of heat exchangers can be used with the exemplary embodiments. The back pan 50 may contain a substantially planar surface, and preferably has a pair of opposing substantially planar surfaces. Alternatively the back pan 50 may be pan shaped, such that the bank pan comprises a flat surface having a thickness and a boundary wall along the perimeter of the flat surface. The back pan 50, perimeter wall 7, and rear panel 10 may define an electronics compartment. In other embodiments, particularly when the back pan 50 may be pan shaped, the back pan 50 and the rear panel 10 alone may defined the electronics compartment.

A number of fans, such as closed loop fans 15 and open loop fans 20a-20c may be secured within the assembly to cause a flow of fluid, such as air. The assembly 5 may comprise multiple different flow paths, such as a closed loop and multiple different open loops (whose flow preferably does not mix with the fluid travelling in the closed loop). Fans, such as closed loop fans 15 and open loop fans 20a-20c, may be utilized to force the fluid through the flow paths, as will be explained in greater detail below. Closed loop fans 15, may be dedicated to circulating fluid through the closed loop. In one embodiment, the closed loop fans 15 may be secured along a pair of side channels 52a and/or 52b that run substantially the length of a side of the back pan 50 and provide a channel for closed loop fluid to circulate.

Similarly, a number of fans such as open loop fans 20a-20c may be dedicated to circulating fluid through one or more of the open loop paths. In one embodiment, these open loop fans 20a-20c may be positioned so as to draw air through select apertures in the perimeter wall 7. Any number of apertures of any size, shape, and orientation are contemplated. Open loop fans 20a-20c may be further dedicated to circulating fluid through specific sub-paths within the open loop. Skilled artisans will note that any number of fans may be utilized. Alternatively, natural conduction and quiescent air flow may be utilized. The operation of the fans and the operation and the details of the flow paths will be explained in greater detail below.

Figure 3:
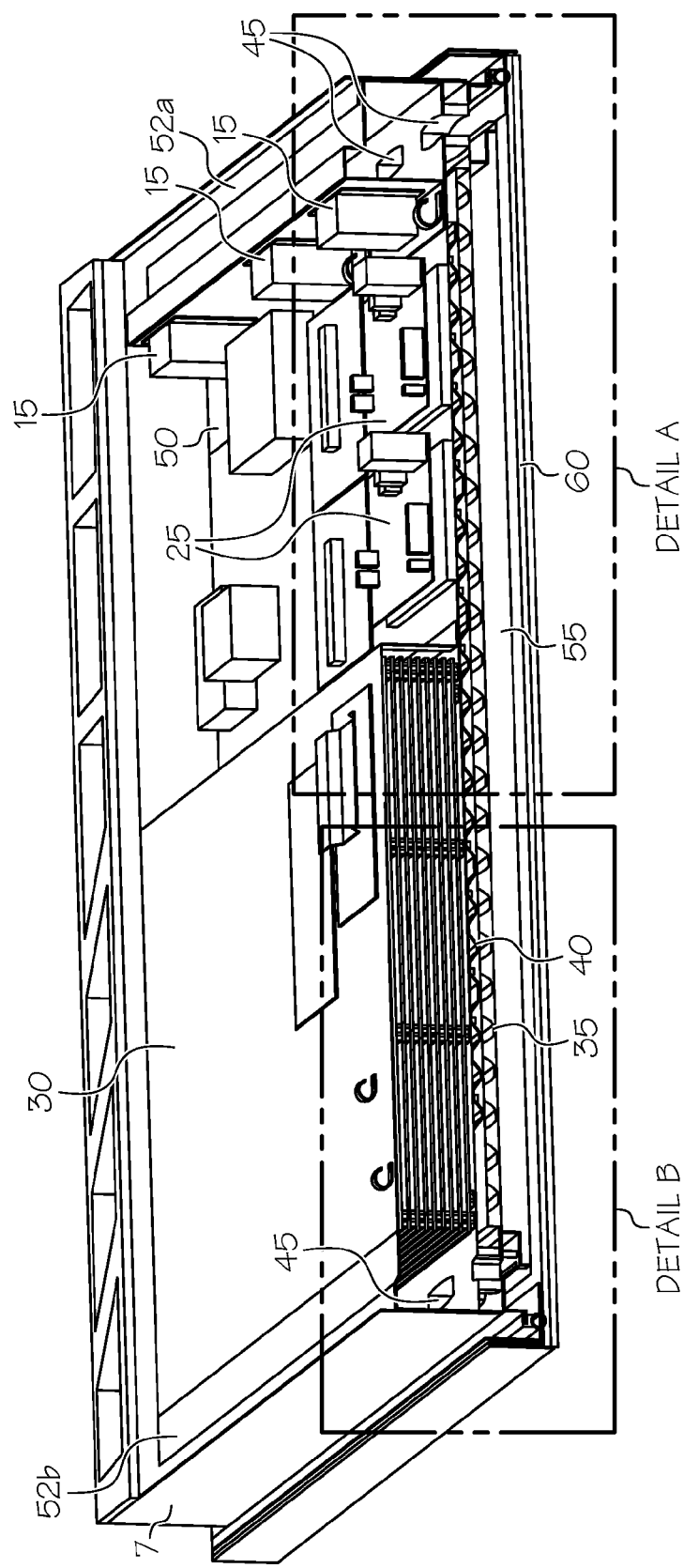
FIG. 3 is a perspective section view of the assembly of FIG. 2 taken along section line Z-Z and indicating Detail A and Detail B.

FIG. 3 shows a sectional view of the assembly 5. Side channels 52a and 52b can be seen extending along each respective side wall of back pan 50. The side channels 52a and 52b are preferably attached to, or from a part of the back pan 50 thereby defining a closed channel. A number of fans, such as closed loop fans 15, may be secured to one of the side channels such that they sit atop apertures therein that permit the flow of circulating fluids therethrough. A first side channel 52a may run along the right side of the assembly 5. A second side channel 52b may run along the left side of the assembly. In an exemplary embodiment, the second side channel 52b is positioned immediately adjacent to heat exchanger 30 such that the flow path through the heat exchanger 30 may empty into the side channel 52b. A number of back pan ports 45 may extend through back pan 50 (as well as the open loop flow paths described below), thereby providing a port that permits airflow from side channels 52a and 52b to a front channel 61. The front channel 61 may be defined by the space between the front surface of the electronic display 55 and the rear surface of a front transparent window 60.

Figure 4:
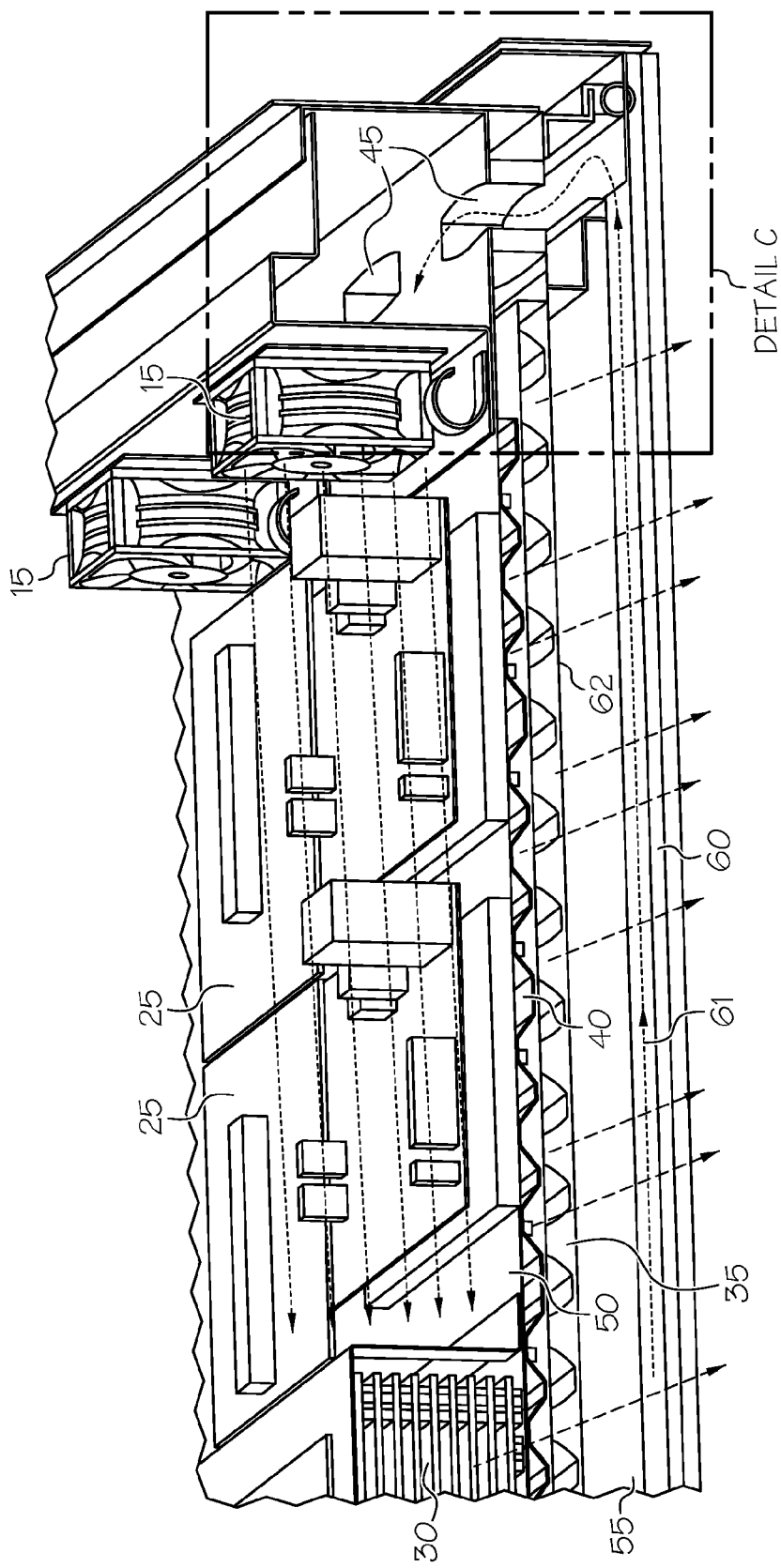
FIG. 4 is a detailed perspective section view of Detail A shown in FIG. 3 and indicating Detail C.
Figure 5:
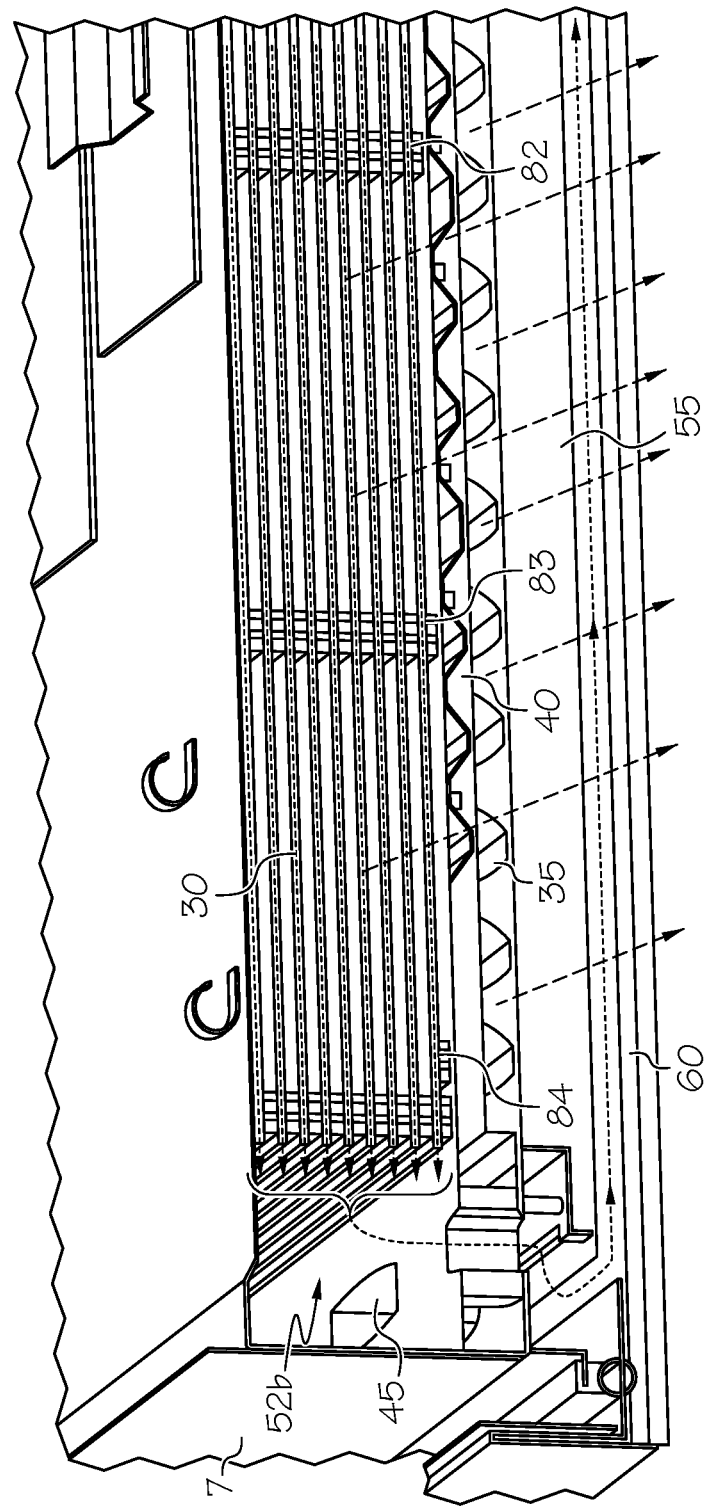
FIG. 5 is a detailed perspective section view of Detail B shown in FIG. 3.

As shown in greater detail in FIG. 4 and FIG. 5, the closed loop fluid is preferably circulated from the fan 15, across the electronics 25, through the heat exchanger 30, left side channel 52b, down through back pan ports 45, through the front channel 61, up through the opposing back pan ports 45, into the right side channel 52a, returning to the closed loop fans 15. Of course some embodiments may not utilize the side channels 52a, 52b or the back pan ports 45 within the closed loop flow.

Figure 6:
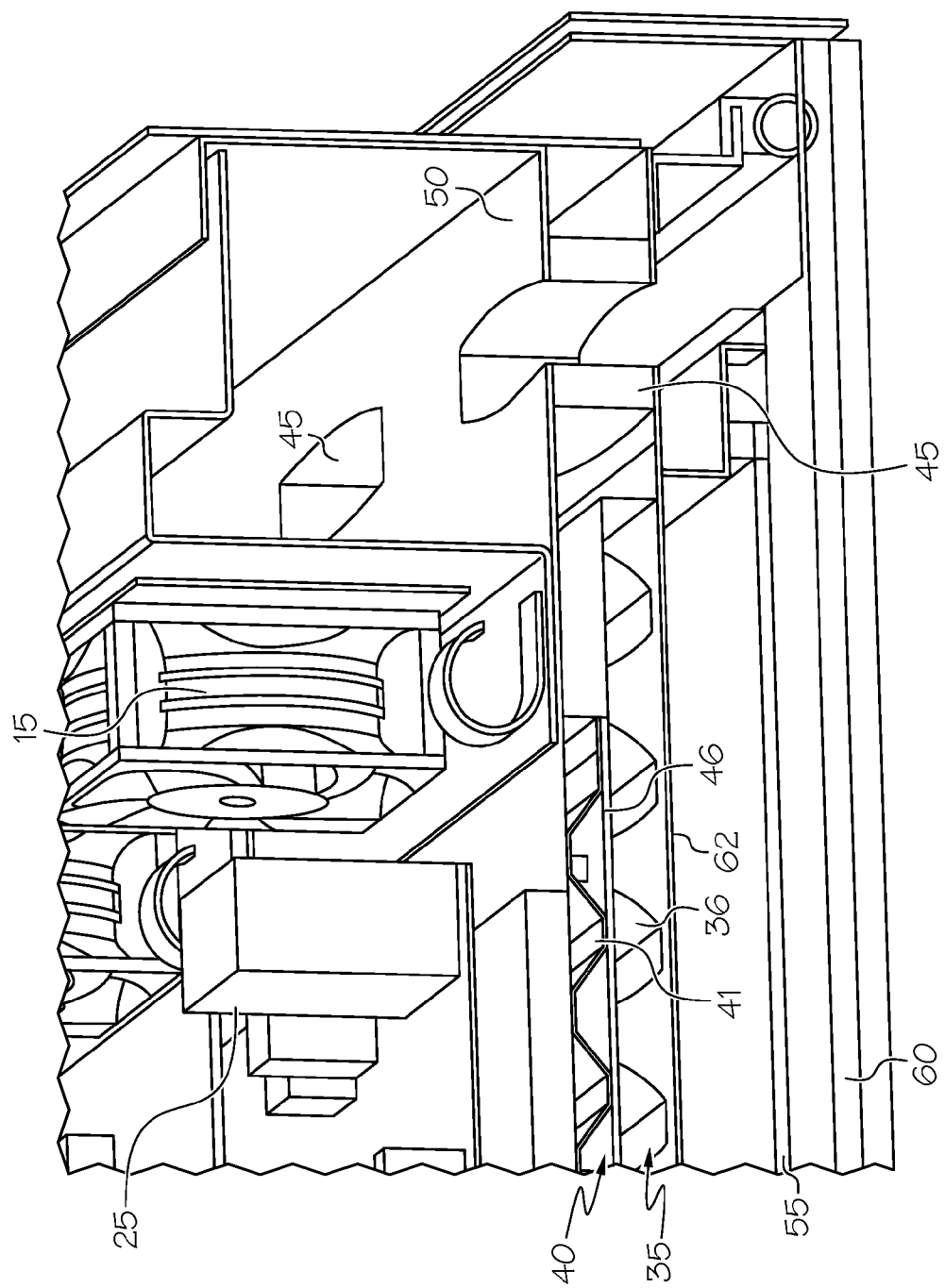
FIG. 6 is a detailed perspective section view of Detail C shown in FIG. 4.
Figure 7:
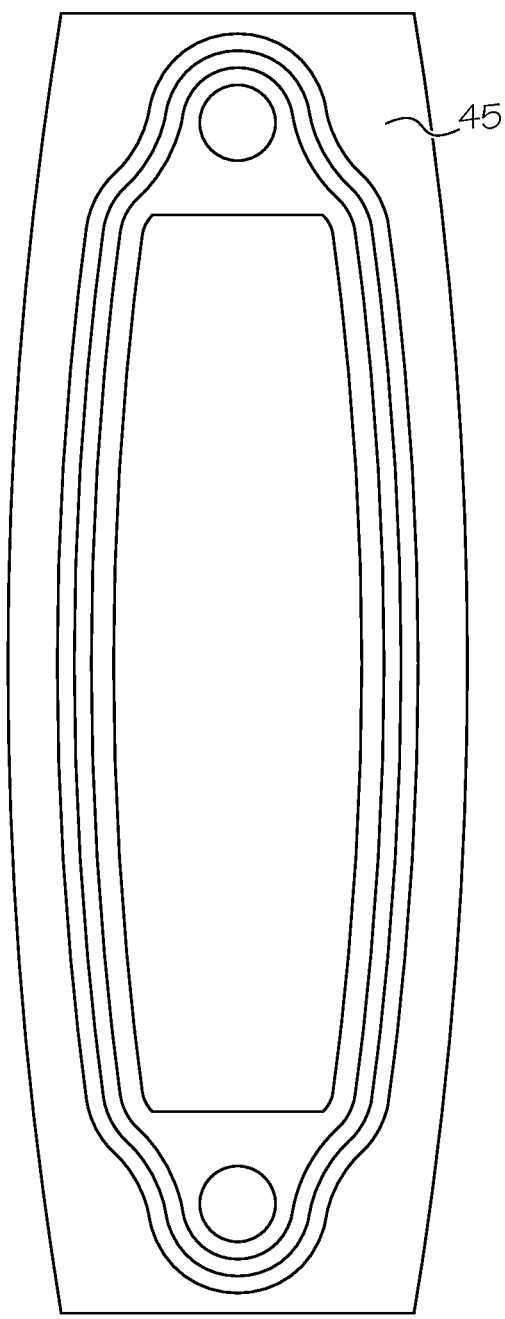
FIG. 7 is top view of the back pan port shown in FIG. 6, shown in isolation from all other surrounding components of the electronic display assembly.

FIG. 6 is a detailed perspective section view of Detail C shown in FIG. 4. FIG. 7 is top view of the back pan port 45 shown in FIG. 6, shown in isolation from all other surrounding components of the electronic display assembly.

Figure 8:
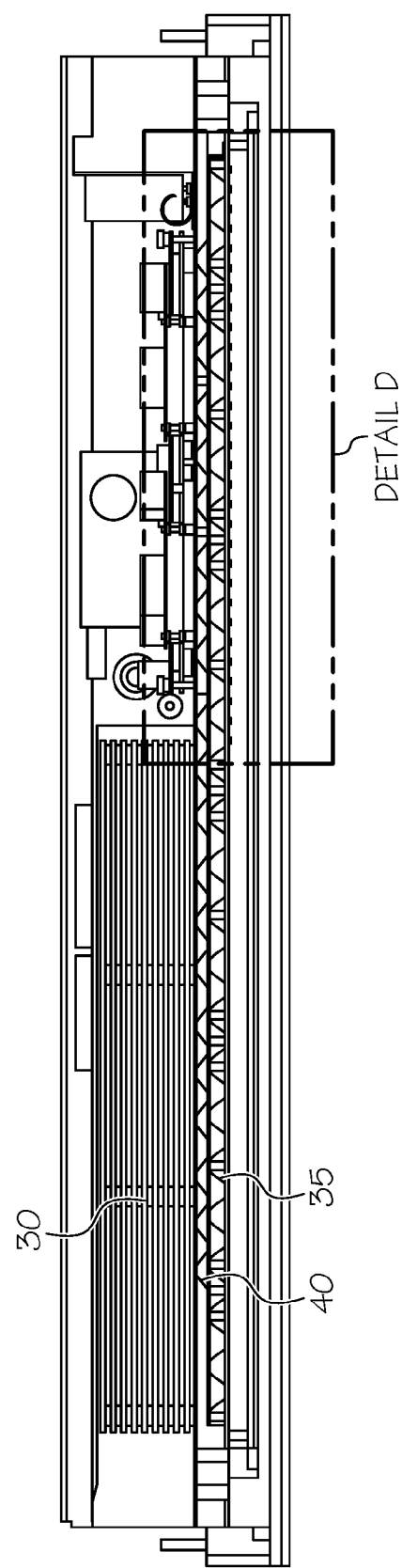
FIG. 8 is a bottom plan section view of the assembly of FIG. 3, taken along the section line Z-Z and indicating Detail D.
Figure 9:
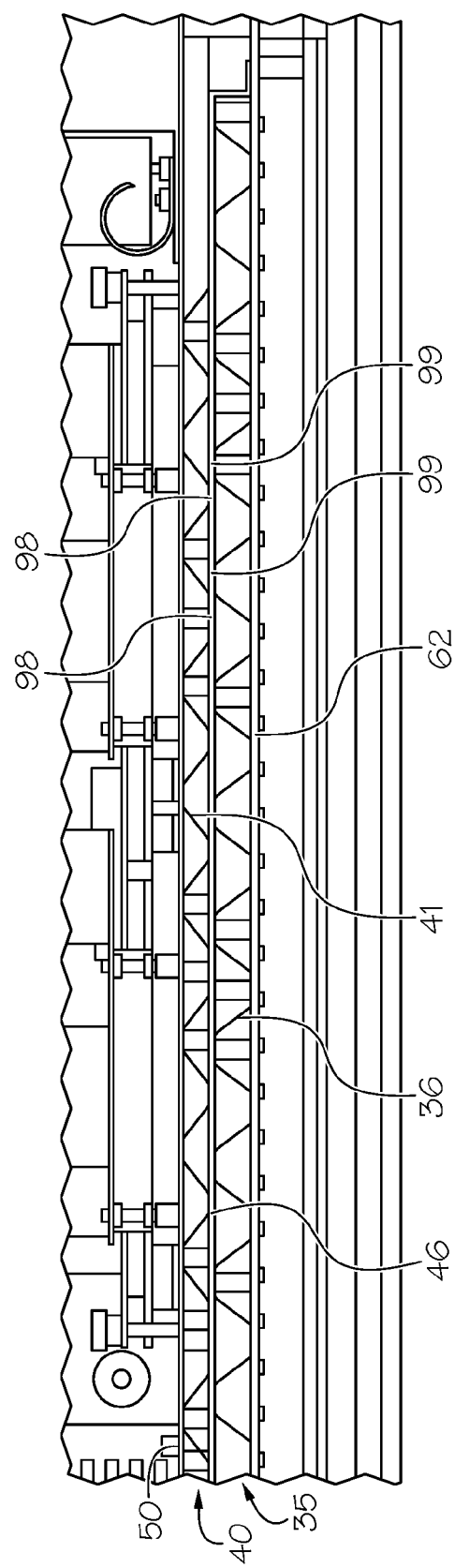
FIG. 9 is a detailed section view of Detail D shown in FIG. 8.

As shown in greater detail in FIG. 8, and FIG. 9, two open loop layers, a rear open loop layer 40 and a front open loop layer 35 may be located adjacent to back pan 50. The front open loop layer 35 may extend over substantially the same surface area as the backlight 62. In some embodiments, the surface area of the rear open loop layer 40 may be less than the surface area of the front open loop layer 35. Each open loop layer may include two partitions, which can provide a gaseous and contaminate barrier between adjacent open loop layers or between the rear open loop layer 40 and the closed loop flow within the electronics cavity.

The rear open loop layer 40 is preferably defined by a rear partition and a front partition. In an exemplary embodiment, the rear partition may be defined by the rear pan 50, but the rear partition could be any substantially planar element that is preferably a good thermal conductor. In this embodiment, the front partition for the rear open loop layer 40 is provided by the plate 46. In an exemplary embodiment, the rear open loop layer 40 would contain a corrugated metallic sheet 41, which alternates contact between the rear partition and front partition. Preferably, the electronics for operating the display 25, especially the power modules, are attached to the back pan 50 so that heat from the electronics 25 may be transferred to the rear open loop layer 40 (and in some embodiments the front open loop layer 35) for removal by the flow of open loop fluid.

The front open loop layer 35 is preferably defined by a rear partition and a front partition. In an exemplary embodiment, the rear partition may be defined by the plate 46, but the rear partition could be any substantially planar element that is preferably a good thermal conductor. In most embodiments, the front partition for the front open loop layer 35 may be provided by any other substantially planar element. In an exemplary embodiment, the front partition for the front open loop layer 35 is provided by the backlight 62. In an exemplary embodiment, the front open loop layer 35 would contain a corrugated metallic sheet 36, which alternates contact between the rear partition and front partition.

In an exemplary embodiment, plate 46 may serve as the front partition for the rear open loop layer 40 while also serving as the rear partition for the front open loop layer 35. In this way, the plate 46 forms a part of both the rear open loop layer 40 and the front open loop layer 35. The corrugated metallic sheets 41 and 36 may be formed from one continuous piece, or may be an assembly of multiple pieces positioned in the alternating peaks and valleys shown in the Figures.

As shown in FIG. 9, in exemplary embodiments the corrugated metallic sheets 41 and 36 may be offset such that the peaks 99 of the corrugated metallic sheet 36 do not line up with the valleys 98 of the corrugated metallic sheet 41. The slanted partitions may be oriented at the same or at varying angles respective to each of the corrugation layers and/or respective to other slanted partitions within each of the corrugation layers. Further, the slanted partitions may be spaced equally or at varying intervals respective to each of the corrugation layers and/or respective to other slanted partitions within each of the corrugation layers. The peaks 99 and valleys 98 preferably contact the adjacent partition, so that heat can be transferred between the open loop partition and the corrugated metallic sheets. The peaks 99 and valleys 98 may be attached to the adjacent partition as well, using any number of attachment methods including but not limited to adhesive, tape, welding, fasteners, rivets, etc. In an exemplary embodiment the corrugated metallic sheet 36 is placed in contact with the rear surface of the backlight 62, which may contain a plurality of LEDs mounted upon a printed circuit board (PCB).

Figure 10:
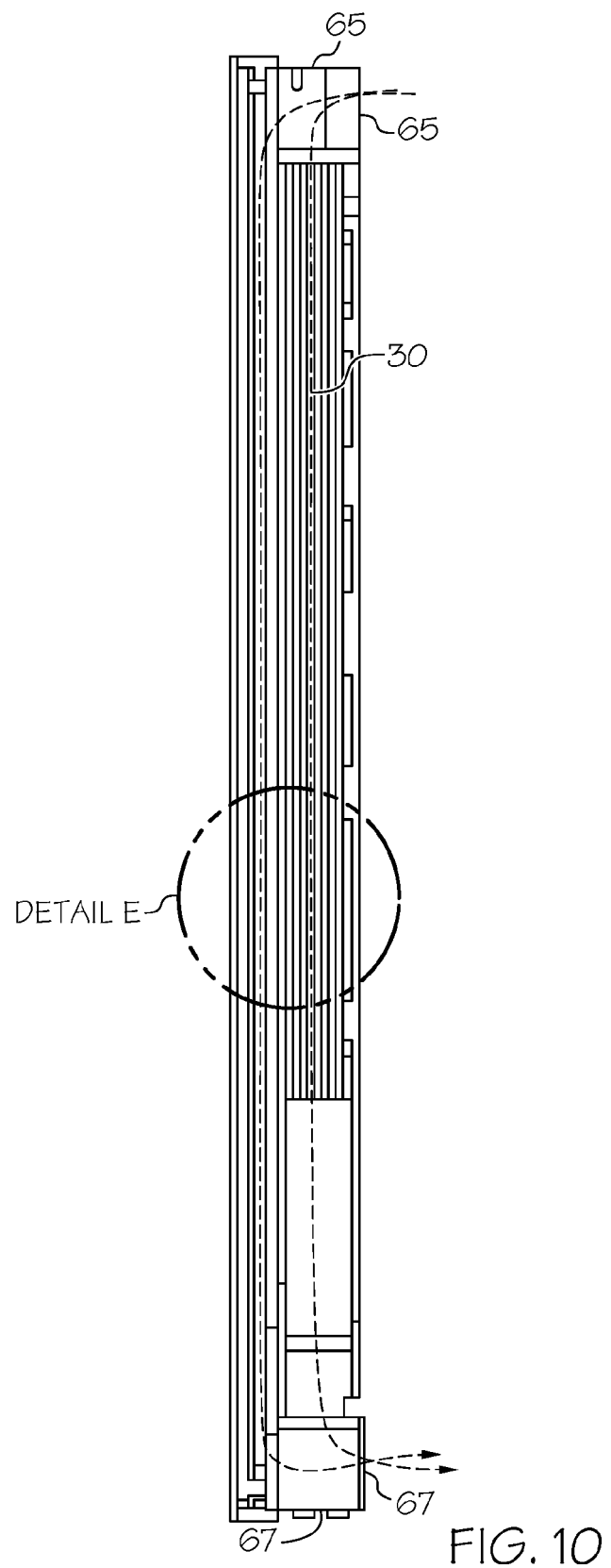
FIG. 10 is an elevation section view of the assembly of FIG. 2 taken along section line Y-Y and indicating Detail E.
Figure 11:
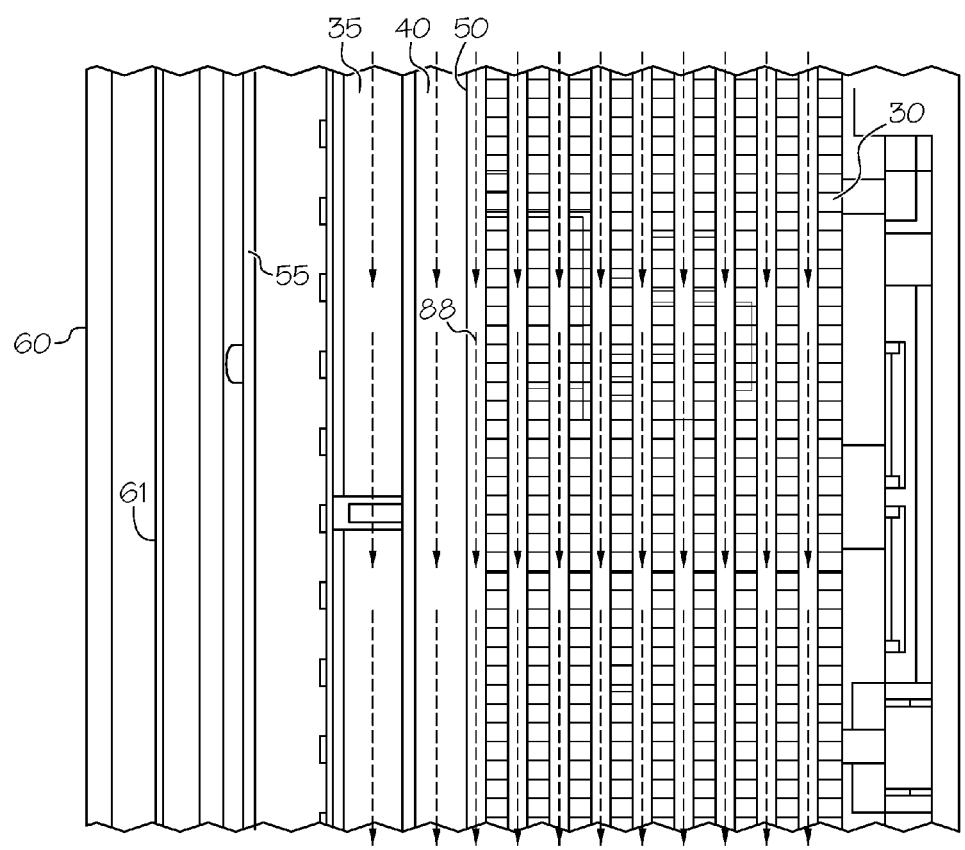
FIG. 11 is a detailed section view of Detail E shown in FIG. 10.

As shown in greater detail in FIG. 10 and FIG. 11, the open loop fluid may be ingested into the top of the assembly 5 via upper apertures 65, pushed through the various open loop flow paths preferably including the heat exchanger 30, and be exhausted out of the bottom of the assembly 5 via lower apertures 67. Any number, size, shape, and orientation of upper apertures 65 and lower apertures 67 are contemplated. It is specifically contemplated that air can be ingested through lower apertures 67 an exhausted out upper apertures 65 as well.

FIG. 11 is a detailed section view of Detail E shown in FIG. 10. Here, several open loop flow paths are shown. A first open loop flow path is provided as the front open loop layer 35. A second open loop flow path is provided by rear open loop layer 40. A third open loop flow path is provided by the heat exchanger 30. In an exemplary embodiment, the third open loop flow path also contains a sub-path 88, which can be defined by the space between the heat exchanger 30 and the rear pan 50.

Figure 12:
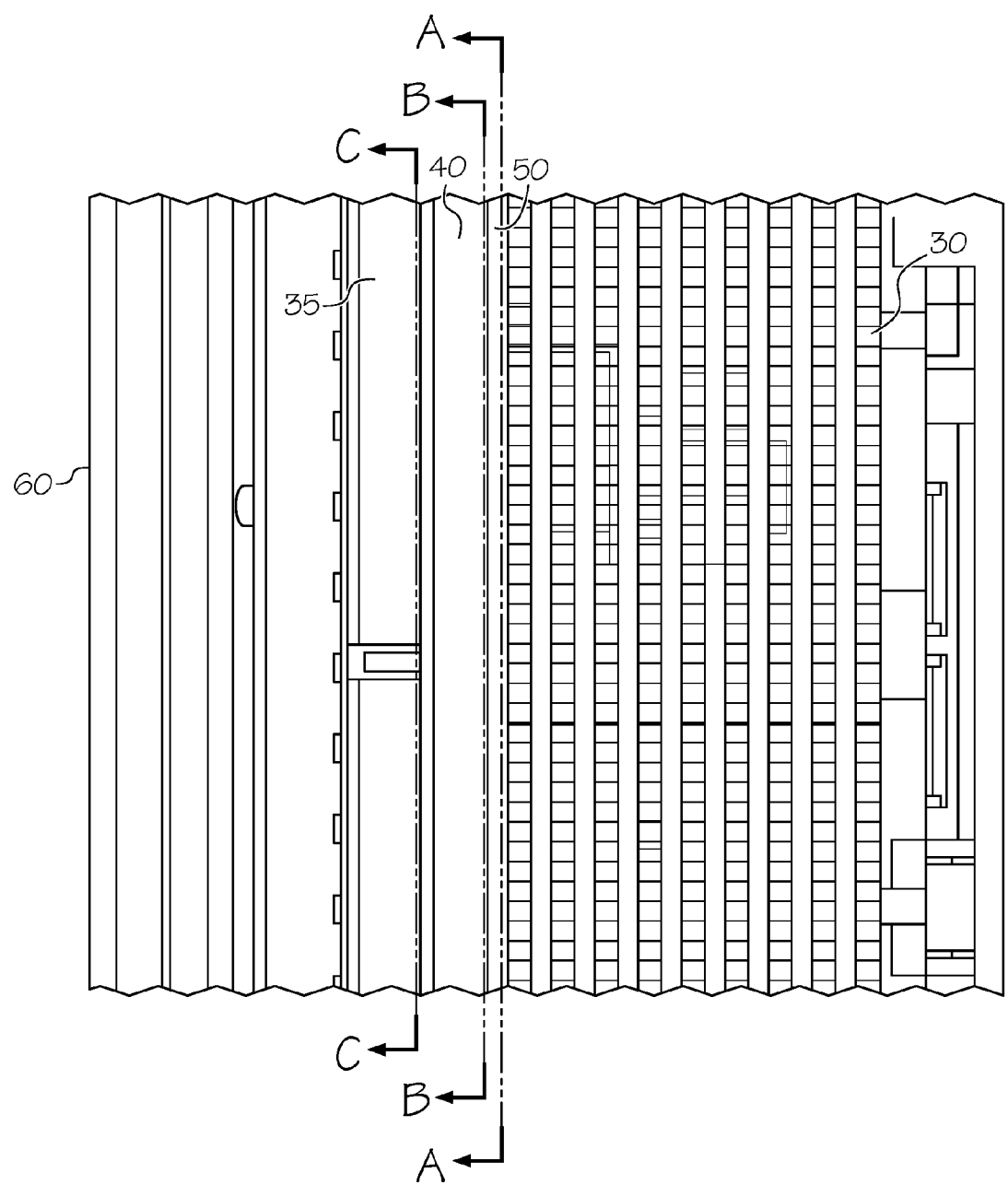
FIG. 12 is a detailed section view of Detail E shown in FIG. 10 with the flow lines removed, and indicating section line A-A, section line B-B, and section line C-C.

FIG. 12 is a detailed section view of Detail E shown in FIG. 10 with the flow lines removed, and indicating section line A-A, section line B-B, and section line C-C.

Figure 13:
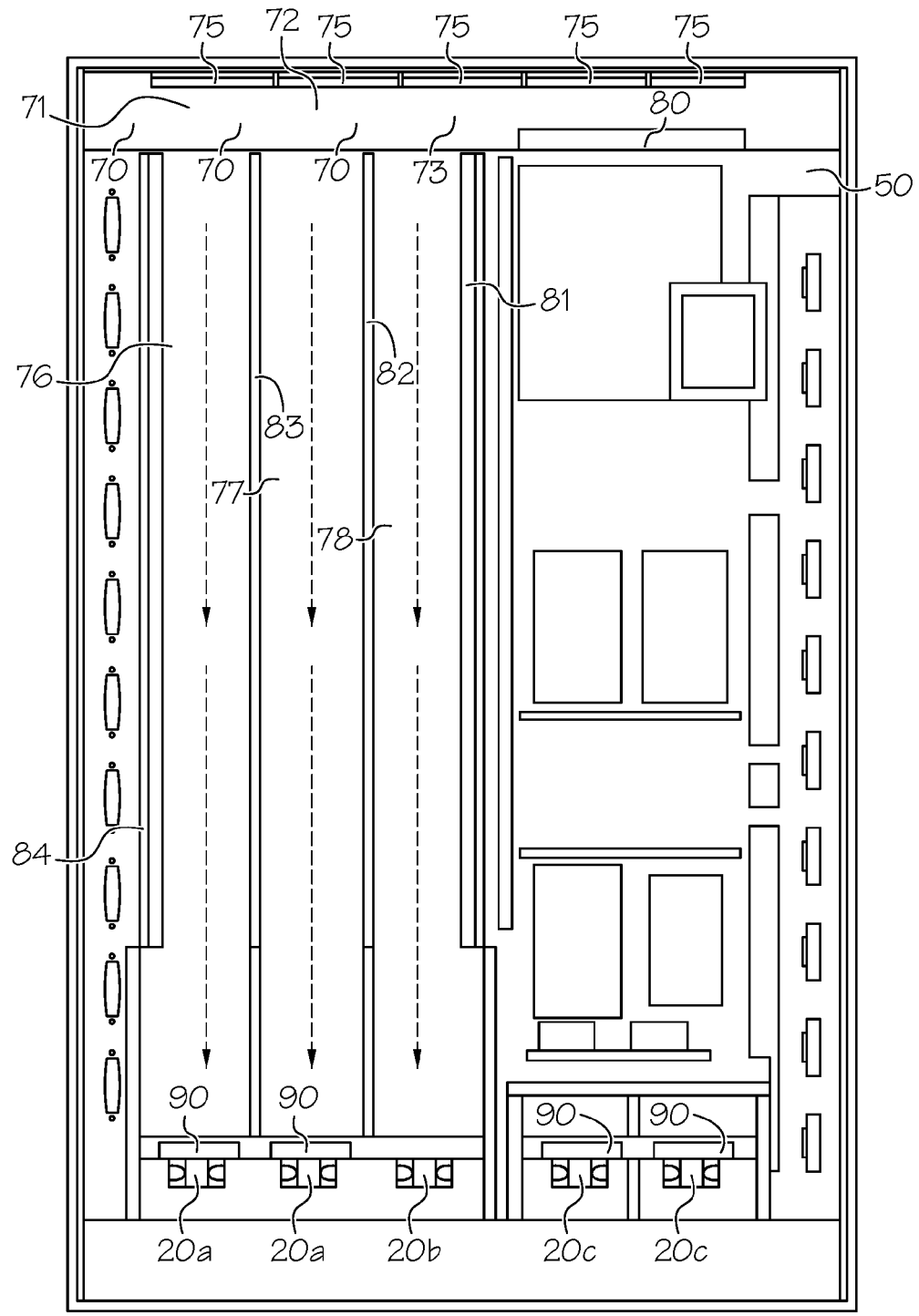
FIG. 13 is an elevation section view of the assembly of FIG. 12 taken along section line A-A.

FIG. 13 illustrates an exemplary embodiment for the third open loop flow path. In this embodiment, the flow through the heat exchanger 30 is controlled by fans 20a as well as fan 20b. As noted above, this flow preferably includes the sub-path 88, which can be defined by the space between the heat exchanger 30 and the rear pan 50. As will be described further below, fan 20b may be sealed relative to the front open loop layer 35 and the rear open loop layer 40, so that fan 20b is primarily drawing fluid through the heat exchanger 30 (and preferably the sub flow path 88). The open loop fluid, such as ambient air, may be taken in through the upper apertures 65 and may be apportioned between the rear open loop layer intake 80 (for rear open loop layer 40), the front open loop layer intakes 75 (for front open loop layer 35), and the heat exchanger intakes 70 (for heat exchanger 30 and optional sub flow path 88) to each respective open loop flow path. The portion of fluid that travels through the heat exchanger intakes 70 may comprise the heat exchanger sub-path 88 fluid.

The heat exchanger sub-path fluid may contact intake air dam 71 and be directed to a series of vertical channels 76, 77, and 78. Similarly, heat exchanger sub-path fluid may contact intake air dam 72 and 73 and be directed to vertical channels 77 and 78, respectively. Vertical channel 76 may be defined by back pan 50, a pair of air dams 84 and 83 located on either side of the vertical channel 76, and the front surface of the heat exchanger 30. Similarly, vertical channel 77 may be defined by back pan 50, air dams 82 and 81, and the front surface of the heat exchanger 30. Also similarly, vertical channel 78 may be defined by back pan 50, air dams 83 and 82, and the rear surface of the heat exchanger 30. In the illustrated embodiment vertical channels 76 and 77 share side air dam 83 and vertical channels 77 and 78 share side air dam 82. In other embodiments, each vertical channel may have a separate pair of air dams. In some embodiments, air dams may not be used.

The travel of fluid through the heat exchanger 30 path and sub-path 88 may be controlled by open loop fans 20a and 20b. As shown in FIG. 13, fans 20a may be positioned to draw fluid through the intakes 90, which will also pull open loop fluid through the front open loop layer 35. In this exemplary embodiment, fan 20b is not positioned to draw fluid through the intake 90, such that the fan 20b is positioned to draw open loop fluid through the heat exchanger 30 and optional heat exchanger sub-path 88, without being capable of drawing open loop fluid through the front open loop layer 35 or the rear open loop layer 40. In this way, fan 20b can be used to precisely control the amount of open loop fluid travelling through the heat exchanger 30 and optional sub-path 88.

Figure 14:
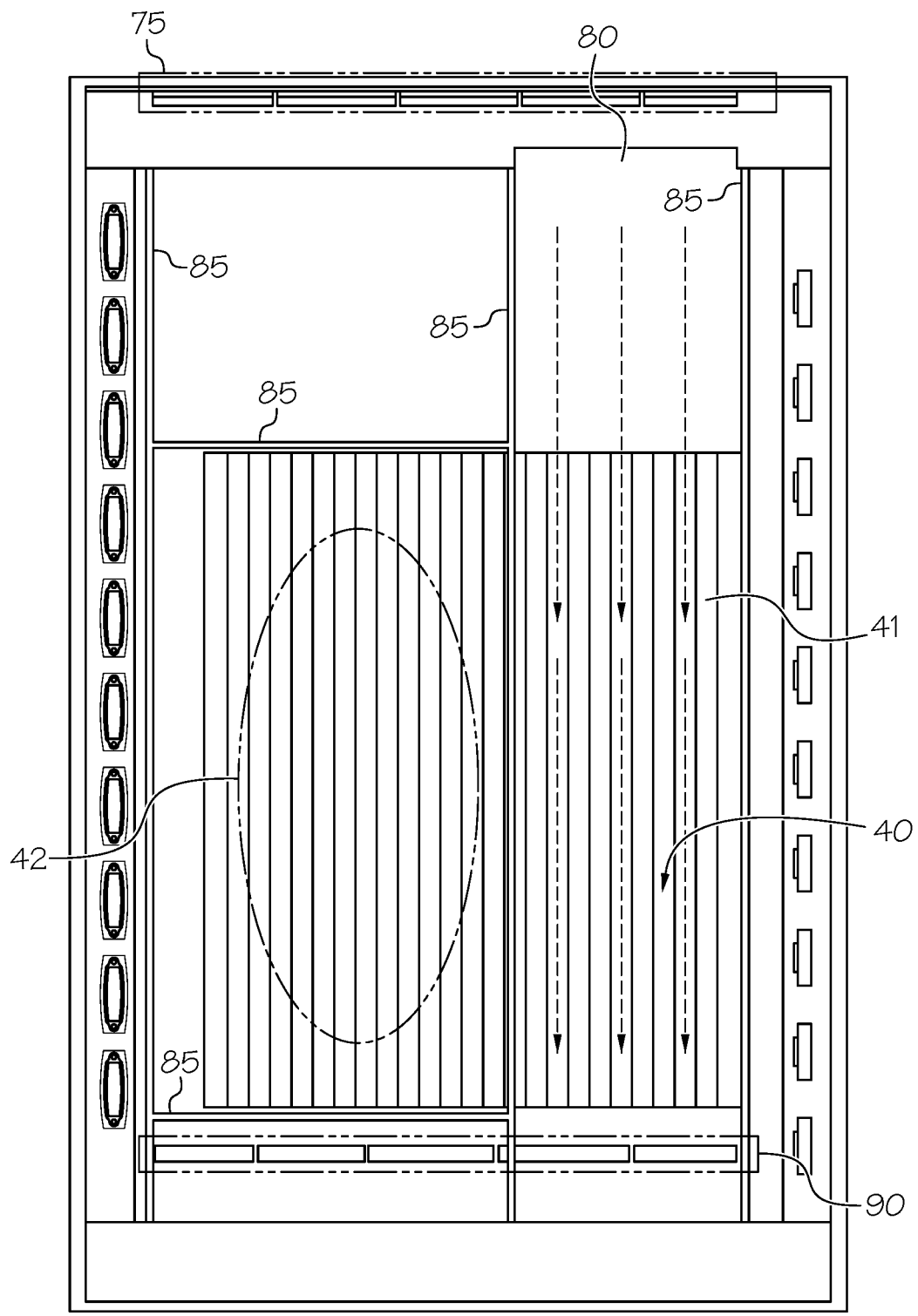
FIG. 14 is an elevation section view of the assembly of FIG. 12 taken along section line B-B.

FIG. 14 illustrates an exemplary embodiment for the rear open loop layer 40. For this layer, open loop fluid is preferably ingested through the rear open loop layer intake 80 and drawn through the rear open loop layer 40, along the optional corrugated metallic sheet 41. This flow of open loop fluid may be controlled by open loop fans 20c. The rear open loop layer 40 may contain a series of air dams 85 from the intake 80 vertically down a channel and through the rear open loop layer 40. Thus, in some embodiments, a portion of the rear open loop layer 40 may be isolated via a series of air dams 85 surrounding the perimeter of said rear open loop layer 40. In some instances, this can create a sealed corrugation compartment 42, which is preferably placed underneath the heat exchanger. In this embodiment, open loop fluid is not drawn through the sealed corrugation compartment 42. The sealed corrugation compartment may comprise its own flow path of a closed loop of quiescent airflow that circulates only within the sealed corrugation compartment. In an exemplary embodiment, heat from the backlight 62 or electronics 25 which is not removed by the front open loop layer 35 or rear open loop layer 40 may be conductively transferred from the sealed corrugation compartment 42 to the rear pan 50, where it can be removed by the optional sub-path 88.

As shown, the fluid being drawn by the fans 20c is preferably flowing underneath (or in front of) the electronics 25 (preferably including the power modules) which are known to produce heat. Again, this heat is preferably transferred through the back pan 50 and into the rear open loop layer 40 for removal. The fluid flow for the rear open loop layer 40 may be combined with flow from the front open loop layer 35 via the intake 90 and exhausted from the bottom of the assembly 5 via lower apertures 67. Because the fans 20a and 20c are positioned to draw open loop fluid through the intakes 90, fans 20a and 20c can draw open loop fluid through the front open loop layer 35 while only fan 20c can draw fluid through the rear open loop layer 40 (due to air dams 85 which separate the rear open loop layer 40 from the sealed compartment 42).

Figure 15:
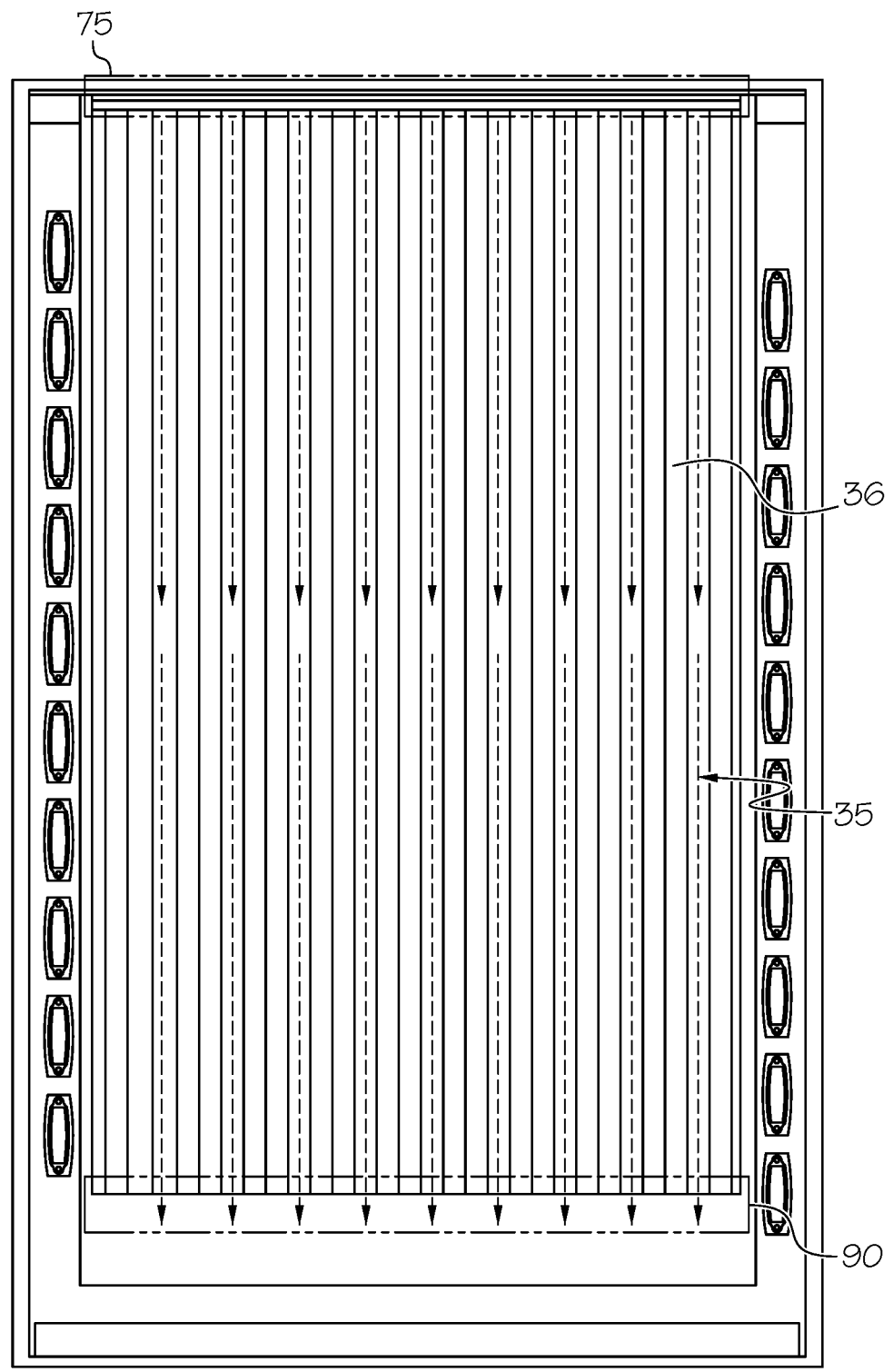
FIG. 15 is an elevation section view of the assembly of FIG. 12 taken along section line C-C.

FIG. 15 illustrates an exemplary embodiment for the front open loop layer 35. Generally, this flow of open loop fluid is ingested through the front open loop intake 75, travels through the open loop layer 35 and across the optional corrugated metallic sheet 36, and pulled out of the intake 90 to be exhausted out of the display assembly 5 via lower apertures 67. As noted above, this flow can be caused and controlled by fans 20a and 20c.

It should also be noted that the variety of open and closed cooling loops that are shown in the figures may be shown in a horizontal or vertical arrangement but it is clearly contemplated that this can be reversed or changed depending on the particular embodiment. Thus, the closed loop may run horizontally or vertically and in a clockwise or counter-clockwise direction. Further, the open loop may also be horizontal or vertical and can run left to right, right to left, and top to bottom, or bottom to top.

Having shown and described a preferred embodiment of the invention, those skilled in the art will realize that many variations and modifications may be made to affect the described invention and still be within the scope of the claimed invention. Additionally, many of the elements indicated above may be altered or replaced by different elements which will provide the same result and fall within the spirit of the claimed invention. It is the intention, therefore, to limit the invention only as indicated by the scope of the claims.

I claim:

1. A cooling system for an electronic display comprising:
a back pan positioned behind the electronic display having at least one electronic component located thereon; and
a rear open loop layer between the back pan and the electronic display; and
a front open loop layer between the rear open loop layer and the electronic display.

2. The cooling system of claim 1 wherein:
each open loop layer comprises a front partition, a rear partition, and a thermally conductive element positioned between the front and rear partitions.

3. The cooling system of claim 1 wherein:
wherein the front open loop layer shares a plate with the rear open loop layer.

4. The cooling system of claim 1 wherein:
the open loop layers contain a corrugation element having a series of peaks and valleys.

5. The cooling system of claim 4 wherein:
the peaks of the front open loop layer do not align with the valleys of the rear open loop layer.

6. The cooling system of claim 4 further comprising:
a fan positioned to draw air through both the front and the rear open loop layers independently.

7. The cooling system of claim 1 further comprising:
a cross-flow heat exchanger positioned behind the back pan.

8. The cooling system of claim 1 further comprising:
a series of air dams dividing the rear open loop layer into at least two sections.

9. The cooling system of claim 8 wherein:
the first section of the rear open loop layer accepts open loop fluid flow, while the second section of the rear open loop layer does not accept open loop fluid flow.

10. A cooling system for an electronic display comprising:
a heat exchanger;
a closed loop flow path that travels through the heat exchanger and encircles the display;
a first open loop layer that travels between the electronic display and a backlight; and
a second open loop layer that travels through the heat exchanger.

11. The cooling system of claim 10, wherein the first open loop layer comprises:
a front partition;
a rear partition; and
a layer of corrugation extending between and alternately contacting the front and rear partition.

12. The cooling system of claim 11, wherein:
the layer of corrugation contains a series of peaks and valleys, where the peaks or valleys contact a rear surface of the backlight.

13. The cooling system of claim 10, further comprising:
a fan positioned to draw open loop fluid through both the heat exchanger and the first open loop layer.

14. The cooling system of claim 10 further comprising:
a third open loop layer positioned adjacent to the first open loop layer, where the third open loop layer and first open loop layer share a partition.

15. The cooling system of claim 10 further comprising:
a third open loop layer positioned adjacent to the first open loop layer, where the third open loop layer comprises a back pan.

16. A cooling system for an electronic display comprising:
a front open loop layer placed behind an electronic display;
a rear open loop layer placed behind the front open loop layer;
a heat exchanger placed behind the rear open loop layer;
a first fan positioned to draw air through the front and rear open loop layers; and
a second fan positioned to draw air through the front layer and the heat exchanger.

17. The cooling system of claim 16 further comprising:
a first corrugated layer positioned along the front open loop layer;
a second corrugated layer positioned along the rear open loop layer.

18. The cooling system of claim 17 further wherein:
the first and second corrugated layer each define a series of peaks and valleys where the peaks of the corrugation within the front open loop layer do not align with the valleys of the corrugation within the rear layer.

19. The cooling system of claim 16 wherein:
an air dam which divides the rear open loop layer into two sections wherein the first fan draws air along one section but the air dam prevents first fan air flow along the second section.

20. The cooling system of claim 16 further comprising:
a closed loop flow of fluid which encircles the display and passes through the heat exchanger, without mixing with the air being drawn by the first and second fan.

* * * * *